(12) United States Patent
Kim

(10) Patent No.: US 9,159,399 B2
(45) Date of Patent: Oct. 13, 2015

(54) DATA TRANSMISSION CIRCUIT AND SEMICONDUCTOR MEMORY DEVICE HAVING THE SAME

(75) Inventor: Seung-Bong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 471 days.

(21) Appl. No.: 13/607,219

(22) Filed: Sep. 7, 2012

(65) Prior Publication Data

US 2013/0163351 A1    Jun. 27, 2013

(30) Foreign Application Priority Data

Dec. 21, 2011 (KR) .................. 10-2011-0139604

(51) Int. Cl.
  *G11C 11/408* (2006.01)
  *G11C 11/4097* (2006.01)

(52) U.S. Cl.
  CPC ........ *G11C 11/4087* (2013.01); *G11C 11/4097* (2013.01); *G11C 2207/005* (2013.01)

(58) Field of Classification Search
  CPC ........... G11C 11/4087; G11C 11/4097; G11C 2207/005; G11C 2207/105
  USPC .................................................. 365/189.15
  See application file for complete search history.

(56) References Cited

U.S. PATENT DOCUMENTS

| | | | | |
|---|---|---|---|---|
| 5,280,451 A | * | 1/1994 | Akaogi | 365/185.04 |
| 6,272,062 B1 | * | 8/2001 | Mueller et al. | 365/230.02 |
| 7,983,095 B2 | * | 7/2011 | Kim et al. | 365/189.05 |
| 2010/0296357 A1 | * | 11/2010 | Kim | 365/230.06 |
| 2011/0044120 A1 | * | 2/2011 | Nakagawa et al. | 365/203 |

FOREIGN PATENT DOCUMENTS

| | | |
|---|---|---|
| KR | 1020070036623 | 4/2007 |
| KR | 1020090070126 | 7/2009 |

* cited by examiner

*Primary Examiner* — Vanthu Nguyen
*Assistant Examiner* — Khamdan Alrobaie
(74) *Attorney, Agent, or Firm* — IP & T Group LLP

(57) ABSTRACT

A data transmission circuit includes first to fourth local lines, one or more first bit line sense amplifiers configured to correspond to the first local line, one or more second bit line sense amplifiers configured to correspond to the second local line, one or more third bit line sense amplifiers configured to correspond to the third local line, one or more fourth bit line sense amplifiers configured to correspond to the fourth local line, and a selection unit configured to select some first to fourth bit line sense amplifiers among the first to fourth bit line sense amplifiers in response to a first address in a first mode, and select some first and second bit line sense amplifiers or some third and fourth bit line sense amplifiers among the first to fourth bit line sense amplifiers in response to the first address and a second address in a second mode.

12 Claims, 2 Drawing Sheets

DATA TRANSMISSION CIRCUIT AND SEMICONDUCTOR MEMORY DEVICE HAVING THE SAME

CROSS-REFERENCE TO RELATED APPLICATIONS

The present application claims priority of Korean Patent Application No. 10-2011-0139604, filed on Dec. 21, 2011, which is incorporated herein by reference in its entirety.

BACKGROUND

1. Field

Exemplary embodiments of the present invention relate to a data transmission circuit and a semiconductor memory device having the same.

2. Description of the Related Art

In general, as the process technology of semiconductor memory devices including a Double Date Rate Synchronous DRAM (DDR SDRAM) is gradually advanced, the number of memory banks provided in a semiconductor memory device has gradually increased. In order to efficiently input and output data to and from the memory banks, the design technology of semiconductor memory devices has been developed in various manners. For example, the design technology may include a method for arranging a plurality of memory banks in a stack structure, or a method for changing an interface between a controller and a semiconductor memory device according to various operation modes such as X4 and X8.

The above-described operation modes such as X4 and X8 for increasing the diversity of interfaces in the semiconductor memory device may relate to operation modes for adjusting the number of data input/output pads (typically, referred to as DQ pads) which are used when data are transferred between the controller and the semiconductor memory device. For example, in the case of a semiconductor memory device including eight data input/output pads, the operation mode thereof may be set to X8 or X4. When the operation mode of the semiconductor memory device is set to X8, the semiconductor memory device performs a data input/output operation through eight input/output pads. When the operation mode of the semiconductor memory device is set to X4, the semiconductor memory device performs a data input/output operation through four data input/output pads.

Meanwhile, when an operation of inputting data to a semiconductor memory device (write operation) is performed, the data is inputted through a data input/output pad from the outside of the semiconductor memory device. Then, the inputted data is transmitted to a write driver through a global line. The write driver transfers the data to a local line. The data of the local line is transmitted to a bit line through a bit line sense amplifier selected by an address and then stored in a memory cell.

When an operation of outputting data of the semiconductor memory device (read operation) is performed, data of a memory cell is transmitted to a bit line. The data of the bit line is amplified by a bit line sense amplifier and transmitted to a local line. The data of the local line is amplified by a main amplifier and transmitted to a global line. The data of the global line is transmitted to the outside of the semiconductor memory device through a data input/output pad.

Here, the numbers of local lines and global lines which are actually used for data input/output operations may differ according to operation modes of the semiconductor memory device, such as X4, X8, and the like. For example, when eight data are inputted (or outputted) per one input/output pad in the X8 operation mode (total 64 data are inputted or outputted), 128 local lines and 64 global lines are used. When eight data are inputted (or outputted) per one input/output pad in the X4 operation mode (total 32 data are inputted or outputted), 64 local lines and 32 global lines are used. Since data transmitted to the local lines are recognized by differential amplifiers, two actual local lines, i.e., one pair of local lines, are used to transmit one data.

The conventional semiconductor memory device transmits 64 data to 128 local lines during a data output operation regardless of whether the operation mode thereof is X8 or X4. Then, depending on the operation modes, the conventional semiconductor memory device operates as follows. In the case of the X8 operation mode, 64 data loaded in 128 local lines are transmitted to 64 global lines through the control of main amplifiers coupled between the local lines and the global lines. Furthermore, in the case of the X4 operation mode, 32 data loaded in 64 local lines are transmitted to 32 global lines, respectively, but 32 data loaded in the other 64 local lines are not transmitted to global lines.

Since the data transmission is performed through a flowing current, the current are passed through the bit lines, the local lines, and the global lines during the data transmission. As the conventional semiconductor memory device transmits the 32 data, which are not to be outputted, to the local lines from a memory bank, unnecessary currents passes through inside of the semiconductor memory device (in particular, when the semiconductor memory device operates in the X4 operation mode). As a result, the power consumption of the semiconductor memory device inevitably increases. Even when the semiconductor memory device performs data input/output operations, similar concerns may occur.

SUMMARY

An embodiment of the present invention is directed to a data transmission circuit capable of preventing an unnecessary current from flowing through local lines by decoupling the local lines to bit lines, which are not required to be coupled to each other, when the number of data input/output pads is reduced depending on an input/output operation mode, thereby reducing power consumption, and a semiconductor memory device having the same.

In accordance with an embodiment of the present invention, a data transmission circuit includes first to fourth local lines; one or more first bit line sense amplifiers configured to correspond to the first local line and correspond to one or more first bit lines, respectively; one or more second bit line sense amplifiers configured to correspond to the second local line and correspond to one or more second bit lines, respectively; one or more third bit line sense amplifiers configured to correspond to the third local line and correspond to one or more third bit lines, respectively; one or more fourth bit line sense amplifiers configured to correspond to the fourth local line and correspond to one or more fourth bit lines, respectively; and a selection unit configured to select some first to fourth bit line sense amplifiers among the first to fourth bit line sense amplifiers in response to a first address in a first mode, and select some first and second bit line sense amplifiers or some third and fourth bit line sense amplifiers among the first to fourth bit line sense amplifiers in response to the first address and a second address in a second mode.

In accordance with another embodiment of the present invention, a semiconductor memory device includes first to fourth local lines; one or more first bit line sense amplifiers configured to correspond to the first local line and correspond to one or more bit lines, respectively; one or more second bit line sense amplifiers configured to correspond to the second local line and correspond to one or more bit lines, respectively; one or more third bit line sense amplifiers configured to correspond to the third local line and correspond to one or more bit lines, respectively; one or more fourth bit line sense amplifiers configured to correspond to the fourth local line and correspond to one or more bit lines, respectively; first to fourth global lines configured to correspond to the first to fourth local lines, respectively; first to fourth write drivers configured to drive data of the first to fourth global lines to the first to fourth local lines, respectively, during a write operation; first to fourth main amplifiers configured to amplify data of the first to fourth local lines and transmit the amplified data to the first to fourth global lines, respectively, during a read operation; and a selection unit configured to select some first to fourth bit line sense amplifiers among the first to fourth bit line sense amplifiers in response to a first address in a first mode, and select some first and second bit line sense amplifiers or some third and fourth bit line sense amplifiers among the first to fourth bit line sense amplifiers in response to the first address and a second address in a second mode.

A semiconductor memory device includes plural cell areas including an even number of bit lines and an even number of bit line amplifiers, each coupled to the one or more bit lines; and an even number of local lines, each coupled to each of the bit line amplifiers, wherein the numbers of the enabled bit line amplifiers and the activated cell areas are determined based on the number of I/O pads activated for data transmission.

DETAILED DESCRIPTION

Figure 1:
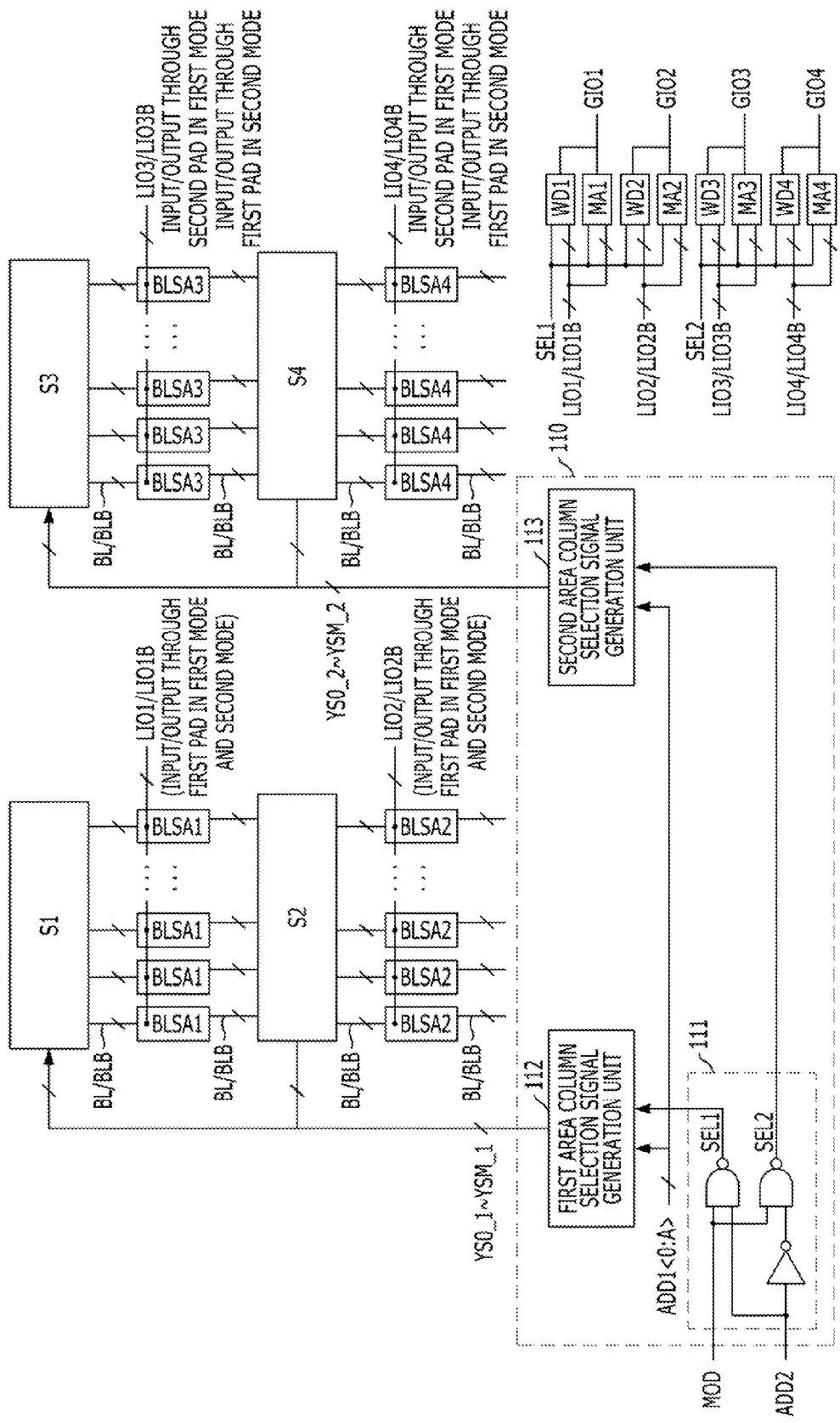
FIG. 1 is a block diagram showing a semiconductor memory device including a data transmission circuit in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereafter, a bit line includes a bit line BL and a bit line bar BLB for transmitting differential data, and a local line includes a local line LIO and a local line bar LIOB. The different data may include data and data bar, and the data bar is obtained by inverting the data.

FIG. 1 is a block diagram showing a semiconductor memory device including a data transmission circuit in accordance with an embodiment of the present invention. For convenience of description, FIG. 1 illustrates a semiconductor memory device which operates to input or output data through two data input/output pads (hereafter, referred to as a first mode corresponding to the above-described X8 operation mode) or one data input/output pad (hereafter, referred to as a second mode corresponding to the above-described X4 operation mode).

Referring to FIG. 1, the semiconductor memory device includes first to fourth local lines LIO1/LIO1B to LIO4/LIO4B, one or more first bit line sense amplifiers BLSA1, one or more second bit line sense amplifiers BLSA2, one or more third bit line sense amplifiers BLSA3, one or more fourth bit line sense amplifiers BLSA4, first to fourth global lines GIO1 to GIO4, first to fourth write drivers WD1 to WD4, first to fourth main amplifiers MA1 to MA4, and a selection unit 111. The one or more bit line sense amplifiers BLSA1 are configured to correspond to the first local line LIO1/LIO1B and correspond to one or more bit lines BL/BLB, respectively. The one or more second bit line sense amplifiers BLSA2 are configured to correspond to the second local line LIO2/LIO2B and correspond to one or more bit lines BL/BLB, respectively. The one or more third bit line sense amplifiers BLSA3 are configured to correspond to the third local line LIO3/LIO3B and correspond to one or more bit lines BL/BLB, respectively. The one or more fourth bit line sense amplifiers BLSA4 are configured to correspond to the fourth local line LIO4/LIO4B and correspond to one or more bit lines BL/BLB, respectively. The first to fourth global lines GIO1 to GIO4 are configured to correspond to the first to fourth local lines LIO1/LIO1B to LIO4/LIO4B, respectively. The first to fourth write drivers WD1 to WD4 are configured to transfer data of the first to fourth global lines GIO1 to GIO4 to the first to fourth local lines LIO1/LIO1B, respectively, during a write operation (when an operation of inputting data to the semiconductor memory device is performed). The first to fourth main amplifier MA1 to MA4 are configured to amplify the data of the first to fourth local lines LIO1/LIO1B and transmit the amplified data to the first to fourth global lines GIO1 to GIO4, respectively, during a read operation (when an operation of outputting data of the semiconductor memory device is performed). The selection unit 111 is configured to select some first to fourth bit line sense amplifiers among the first to fourth bit line sense amplifiers BLSA1 to BLSA4 in response to a first address ADD1<0:A> in a first mode, and select some first and second bit line sense amplifiers or some third and fourth bit line sense amplifiers among the first to fourth bit line sense amplifiers BLSA1 to BLSA4 in response to the first address ADD1<0:A> and a second address ADD2 in a second mode.

Furthermore, the semiconductor memory device includes a plurality of cell arrays S1 to S4 each including a plurality of memory cells. Here, the cell arrays S1 to S4 may include banks. The core area of the semiconductor memory device may have a structure in which the cell arrays S1 to S4 and the bit line sense amplifiers BLSA1 to BLSA4 are alternately arranged as illustrated in FIG. 1. The respective bit line sense amplifiers BLSA1 to BLSA4 transmit data to memory cells included in the cell arrays disposed above and below the bit line sense amplifiers or receive data from the memory cells through the bit lines BL/BLB coupled to the tops and bottoms of the bit line sense amplifiers.

Hereafter, referring to FIG. 1, the data transmission circuit and the semiconductor memory device will be described. In the following descriptions, the operation of the semiconductor memory device of FIG. 1 will be divided into a case in which the semiconductor memory device operates in the first mode where two data input/output pads are used for data input/output operation and another case in which the semiconductor memory device operates in the second mode where one data input/output pad is used for data input/output operation. For convenience of description, an area including the cell arrays S1 and S2 and the first and second bit line sense amplifiers BLSA1 and BLSA2 is referred to as a 'first area'. Another area including the cell arrays S3 and S4 and the third and fourth bit line sense amplifiers BLSA3 and BLSA4 is referred to as a 'second area'. The first and second write drivers WD1 and WD2 and the first and second main amplifiers MA1 and MA2 correspond to the first area. The third and fourth write drivers WD3 and WD4 and the third and fourth main amplifiers MA3 and MA4 correspond to the second area.

(1) When the Semiconductor Memory Device Operates in the First Mode

In this case, it is assumed that the semiconductor memory device of FIG. 1 inputs or outputs two data through a first pad and a second pad, respectively, in the first mode.

When the semiconductor memory device operates in the first mode, data are accessed in both of the first area and the second area, regardless of the second address ADD2 indicating an operating mode. When the semiconductor memory device operates in the first mode, data of the first local line LIO1/LIO1B includes first data which is firstly inputted or outputted through the first pad (not illustrated in FIG. 1), and second data of the second local line LIO2/LIOB2 includes data which is secondly inputted or outputted through the first pad. Furthermore, data of the third local line LIO3/LIOB3 includes third data which is firstly inputted or outputted through the second pad (not illustrated in FIG. 1), and fourth data of the fourth local line LIO4/LIO4B includes data which is secondly inputted or outputted through the second pad.

In the first mode, the selection unit 110 activates one column selection signal of column selection signals YS0_1 to YSM_1 (hereafter, referred to as first area column selection signals) applied to the first area and one column selection signal of column selection signals YS0_2 to YSM_2 (hereafter, referred to as second area column selection signals) applied to the second area, in response to the first address ADD1<0:A> regardless of the second address ADD2. In the semiconductor memory device of FIG. 1, each of the first area column selection signals YS0_1 to YSM_1 corresponds to one first bit line sense amplifier BLSA1 and one second bit line sense amplifier BLSA2, and each of the second area column selection signals YS0_2 to YSM_2 corresponds to one third bit line sense amplifier BLSA3 and one fourth bit line sense amplifier BLSA4. For example, the first area column selection signal YS0_1 corresponds to the first and second bit line sense amplifiers BLSA1 and BLSA2 arranged at the first column of the bit line sense amplifier columns, and the first area column selection signal YS1_1 corresponds to the first and second bit line sense amplifiers BLSA1 and BLSA2 arranged at the second column of the bit line sense amplifier columns.

Each of the first to fourth bit line sense amplifiers BLSA1 to BLSA4 electrically couples a bit line and a local line which correspond to the bit line sense amplifier, when a column selection signal corresponding to the bit line sense amplifier is activated. For example, when the first area column selection signal YS0_1 is activated, a bit line BL/BLB corresponding to the first and second bit line sense amplifiers BLSA1 and BLSA2 arranged at the first column of the bit line sense amplifier columns is coupled to a corresponding local line LIO/LIOB. The tops and bottoms of the bit line sense amplifiers BLSA1 to BLSA4 of FIG. 1 are coupled to the bit lines BL/BLB. During a period where data of a memory cell is accessed, only one pair of bit line BL/BLB between two pairs of bit lines BL/BLB coupled to the top and bottom of each bit line sense amplifier is selected by a bit line selection signal (not illustrated in FIG. 1), and the selected bit line BL/BLB is electrically coupled to a local line.

Furthermore, the selection unit 110 selects the first to fourth write drivers WD1 to WD4, corresponding to the first area and the second area, or the first to fourth main amplifiers MA1 to MA4, corresponding to the first area and the second area, regardless of the second address ADD2. The selected first to fourth write drivers WD1 to WD4 are enabled, during a write operation of the semiconductor memory device, to transfer data, inputted to the first and second pads and transmitted to the first to fourth global lines GIO1 to GIO4, to the first to fourth local lines LIO1/LIO1B to LIO4/LIO4B, respectively. The selected first to fourth main amplifiers MA1 to MA4 are enabled, during a write operation of the semiconductor memory device, to amplify data which are transferred from the cell arrays and transmitted to the first to fourth local lines LIO1/LIO1B to LIO4/LIO4B, and to output the amplified data to the first to fourth global lines GIO1 to GIO4, respectively. The detailed configuration and operation of the selection unit 110 will be described below with reference to FIG. 2.

During the write operation of the semiconductor memory device, the first data, which are firstly inputted through the first pad are transmitted through the first global line GIO1, the first write driver WD1 and the first local line LIO1/LIO1B into the first bit line sense amplifier BLSA1, selected in response to the first address ADD1<0:A>, and then stored in a memory cell. The second data, which are secondly inputted through the first pad are transmitted through the second global line GIO2, the second write driver WD2 and the second local line LIO2/LIO2B into the second bit line sense amplifier BLSA2, selected in response to the first address ADD1<0:A>, and then stored in a memory cell. The third data, which are firstly inputted through the second pad are transmitted through the third global line GIO3, the third write driver WD3 and the third local line LIO3/LIO3B into the third bit line sense amplifier BLSA3, selected in response to the first address ADD1<0:A>, and then stored in a memory cell. The fourth data, which are secondly inputted through the second pad are transmitted through the fourth global line GIO4, the fourth write driver WD4 and the fourth local line LIO4/LIO4B into the fourth bit line sense amplifier BLSA4, selected in response to the first address ADD1<0:A>, and then stored in a memory cell, In the read operation of the semiconductor memory device, the first data, which are transmitted to a bit line BL/BLB from a memory cell and amplified by the first bit line sense amplifier BLSA1 selected in response to the first address ADD1<0:A>, are transmitted through the first local line LIO1/LIO1B and the first main amplifier MA1 to the first global line GIO1 and then firstly outputted through the first pad. The second data, which are transmitted to a bit line BL/BLB from a memory cell and amplified by the second bit line sense amplifier BLSA2 selected in response to the first address ADD1<0:A>, are transmitted through the second local line LIO2/LIO2B and the second main amplifier MA2 to the second global line GIO2 and then secondly outputted through the first pad. The third data, which are transmitted to a bit line BL/BLB from a memory cell and amplified by the third bit line sense amplifier BLSA3 selected in response to the first address ADD1<0:A>, are transmitted through the third local line LIO3/LIO3B and the third main amplifier MA3 to the third global line GIO3 and then firstly outputted through the second pad. The fourth data, which are transmitted to a bit line BL/BLB from a memory cell and amplified by the fourth bit line sense amplifier BLSA4 selected in response to the first address ADD1<0:A>, are transmitted through the fourth local line LIO4/LIO4B and the fourth main amplifier MA4 to the fourth global line GIO4 and then secondly outputted through the second pad.

(2) When the Semiconductor Memory Device Operates in the Second Mode

In this case, it is assumed that the semiconductor memory device of FIG. 1 inputs/outputs two data through only the first pad in the second mode (that is, the second pad is not used for data input/output operation).

When the semiconductor memory device operates in the first mode, the first area or the second area is selected in response to the second address ADD2. When the first area is selected, data of the first local line LIO1/LIO1B include first data which are firstly inputted or outputted through the first pad, and data of the second local line LIO2/LIO2B include second data which are secondly inputted or outputted through the first pad. When the second area is selected, data of the third local line LIO3/LIO3B include third data which are firstly inputted or outputted through the first pad, and data of the fourth local line LIO4/LIO4B include fourth data which are secondly inputted or outputted through the first pad.

In the second mode, the selection unit 110 activates one column selection signal of the first area column selection signals YS0_1 to YSM_1 or activates one column selection signal of the second area column selection signals YS0_2 to YSM_2, in response to the first address ADD1<0:A> and the second address ADD2. The relation among the column selection signals, the bit line sense amplifiers, and the bit lines may be established in the same manner as described above.

The selection unit 110 selects the first and second write drivers WD1 and WD2 and the first and second main amplifiers MA1 and MA2 corresponding to the first area or selects the third and fourth write drivers WD3 and WD4 and the third and fourth main amplifiers MA3 and MA4 corresponding to the second area, according to the value of the second address ADD2. When the first and second write drivers WD1 and WD2 and the first and second main amplifiers MA1 and MA2 corresponding to the first area are selected, the first and second write drivers WD1 and WD2 are enabled during the write operation, and the first and second main amplifiers MA1 and MA2 are enabled during the read operation. When the third and fourth write drivers WD3 and WD4 and the third and fourth main amplifiers MA3 and MA4 corresponding to the second area are selected, the third and fourth write drivers WD3 and WD4 are enabled during the write operation, and the third and fourth main amplifiers MA3 and MA4 are enabled during the read operation. The descriptions of the enabled first to fourth write drivers WD1 to WD4 and the enabled first to fourth main amplifiers MA1 to MA4 may be made in the same manner as described above.

FIG. 1 illustrates a case in which the selection unit 110 selects the bit line sense amplifiers, the write drivers, and the main drivers. However, the semiconductor memory device may separately include a selection circuit for selecting the write drivers and the main drivers. In this case, the selection circuit for selecting the write drivers and the main drivers may include the same circuit as that represented by reference numeral '111'.

During the write operation of the semiconductor memory device, the first data, which are firstly inputted through the first pad, are transmitted to a global line selected between the first and third global lines GIO1 and GIO3 in response to the second address ADD2. Furthermore, second data, which are secondly inputted through the first pad, are transmitted to a global line selected between the second and fourth global lines GIO2 and GIO4 in response to the second address ADD2. The first data, which is delivered to the first global line GIO1, are transmitted through the first write driver WD1 and the first local line LIO1/LIO1B to the first bit line sense amplifier BLSA1 selected in response to the first address ADD1<0:A> and the second address ADD2; and then the first data are stored in a memory cell. The second data, which is transferred to the second global line GIO2, are transmitted through the second write driver WD2 and the second local line LIO2/LIO2B to the second bit line sense amplifier BLSA2 selected in response to the first address ADD1<0:A> and the second address ADD2; and then the second data are stored in a memory cell. The third data, which is delivered to the third global line GIO3, are transmitted through the third write driver WD3 and the third local line LIO3/LIO3B to the third bit line sense amplifier BLSA3 selected in response to the first address ADD1<0:A> and the second address ADD2; and then the third data are stored in a memory cell. The fourth data, which is transferred to the fourth global line GIO4, are transmitted through the fourth write driver WD4 and the fourth local line LIO4/LIO4B to the fourth bit line sense amplifier BLSA4 selected in response to the first address ADD1<0:A> and the second address ADD2; and then the fourth data are stored in a memory cell.

During the read operation of the semiconductor memory device, data are transmitted to the bit lines BL/BLB from memory cells. Only the data of a bit line corresponding to the selected bit line sense amplifier, among the data of the bit lines, are transmitted to a local line. As described above, when the semiconductor memory device operates in the first mode, the selection unit 110 selects one first bit line sense amplifier BLSA1, one second bit line sense amplifier BLSA2, one third bit line sense amplifier BLSA3, and one fourth bit line sense amplifier BLSA4, in response to the first address ADD1<0:A>. On the other hand, when the semiconductor memory device operates in the second mode, the selection unit 110 selects one first bit line sense amplifier BLSA1 and one second bit line sense amplifier BLSA2 (that is, selects bit line sense amplifiers of the first area) or selects one third bit line sense amplifier BLSA3 and one fourth bit line sense amplifier BLSA4, in response to the first address ADD1<0:A> and the second address ADD2. In this case, the data of the bit lines BL/BLB, corresponding to the unselected bit line sense amplifiers, are not transmitted to a local line.

When the first and second bit line sense amplifiers BLSA1 and BLSA2 are selected by the selection unit 110, first data amplified by the selected first bit line sense amplifier BLSA1 are transmitted through the first local line LIO1/LIO1B and the first main amplifier MA1 to the first global line GIO1; and then the first data are firstly outputted through the first pad. Second data amplified by the selected second bit line sense amplifier BLSA2 are transmitted through the second local line LIO2/LIO2B and the second main amplifier MA2 to the second global line GIO2; and then the second data are secondly outputted through the first pad.

When the third and fourth bit line sense amplifiers BLSA3 and BLSA4 are selected by the selection unit 110, third data amplified by the selected third bit line sense amplifier BLSA3 are transmitted through the third local line LIO3/LIO3B and the third main amplifier MA3 to the third global line GIO3; and then the third data are firstly outputted through the first pad. Fourth data amplified by the selected fourth bit line sense amplifier BLSA4 are transmitted through the fourth local line LIO4/LIO4B and the fourth main amplifier MA4 to the fourth global line GIO4; and then the fourth data are secondly outputted through the first pad.

That is, the second address ADD2 serves to select a single area between the first area and the second area for inputting or outputting data through the first pad. When the first area is selected in response to the second address ADD2, the data of the first area are sequentially inputted or outputted through the first pad. When the second area is selected in response to the second address ADD2, the data of the second area are sequentially inputted or outputted through the first pad.

The conventional semiconductor memory device selects one of first bit line sense amplifiers BLSA1s, one of second bit line sense amplifiers BLSA2s, one of third bit line sense amplifiers BLSA3s, and one of fourth bit line sense amplifiers BLSA4s, regardless of the value of the second address ADD2. Data of the bit lines BL/BLB are respectively transferred to the first to fourth local lines LIO1/LIO1B to LIO4/LIO4B even when the memory device operates in the second mode. Since data are transmitted between the bit lines and the local lines of an unselected area between the first and second areas (that is, currents are flown in the unselected area), the current and power consumption inevitably increases.

On the other hand, in the semiconductor memory device in accordance with the embodiment of the present invention, the selection unit 110 to select the bit line sense amplifiers generates a column selection signal in response to the second address ADD2 such that the bit line sense amplifiers included in an unselected area between the first and second areas are not selected. Therefore, since the data of the bit lines BL/BLB included in the unselected area between the first and second areas are not transmitted to the local lines, the current and power consumption may decrease.

Among the components included in the semiconductor memory device of FIG. 1, the first to fourth local lines LIO1/LIO1B to LIO4/LIO4B, the first to fourth bit line sense amplifiers BLSA1 to BLSA4, and the selection unit 110 serve as the data transmission circuit in accordance with the embodiment of the present invention, which is configured to transmit the data of the bit lines BL/BLB to the local lines in response to the first address ADD1<0:A> and the second address ADD2 when the semiconductor memory device operates in the first mode or the second mode. The operation of the data transmission circuit may be performed in the same manner as described above.

Figure 2:
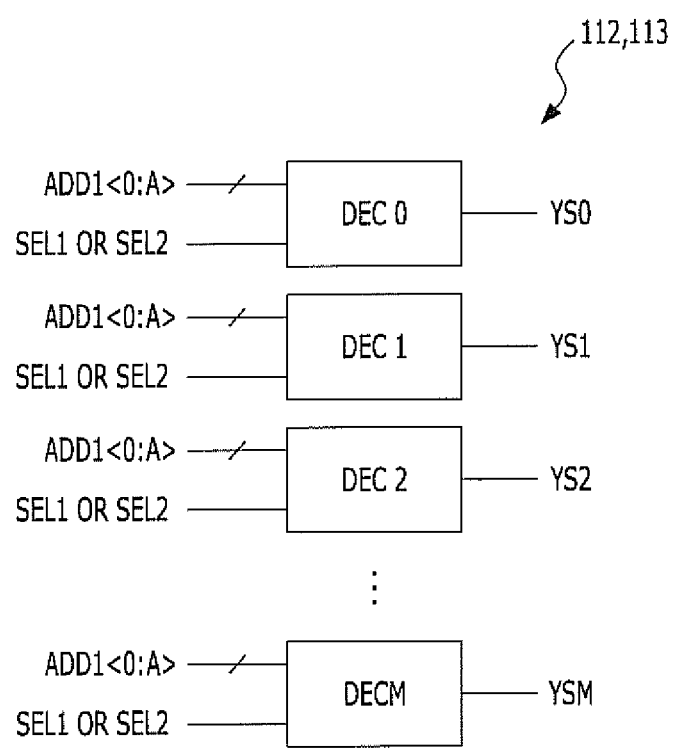
FIG. 2 is a block diagram illustrating a first or second area column signal generation unit included in a selection unit of FIG. 1.

FIG. 2 is a block showing one of the first and second area column selection signal generation units 112 and 113 included in the selection unit 110 in accordance with the embodiment of the present invention. Hereafter, referring to FIGS. 1 and 2, the configuration and operation of the selection unit 110 will be described.

The selection unit 110 is configured to generate the column selection signals YS0_1 to YSM_1 and YS0_2 to YSM_2 either in response to the first address ADD1<0:A> or in response to the first address ADD1<0:A> and the second address ADD2, according to a mode signal MOD indicating whether the semiconductor memory device operates in the first mode or the second mode.

For this operation, the selection unit 110 includes an area selection signal generation unit 111, a first area column selection signal generation unit 112, and a second area column selection signal generation unit 113. The area selection signal generation unit 111 is configured to generate area selection signal SEL1 and SEL2 in response to the mode signal MOD and the second address ADD2. The first area column selection signal generation unit 112 is configured to generate the first area column selection signals YS0_1 to YSM_1 in response to the first area selection signal SEL1 and the first address ADD1<0:A>. The second area column selection signal generation unit 113 is configured to generate the second area column selection signals YS0_2 to YSM_2 in response to the second area selection signal SEL2 and the first address ADD1<0:A>. Here, when the semiconductor memory device operates in the first mode, the mode signal MOD is deactivated to a low level. When the semiconductor memory device operates in the second mode, the mode signal MOD is activated to a high level.

Since the mode signal MOD is deactivated during the first mode operation, the area selection signal generation unit 111 activates both the first area selection signal SEL1 and the second area selection signal SEL2, regardless of the second address ADD2. That is, the selection unit 110 selects both the first area and the second area regardless of the second address ADD2.

Since the mode signal MOD is activated during the second mode operation, the area selection signal generation unit 111 activates one of the first area selection signal SEL1 and the second area selection signal SEL2 to a high level in response to the second address ADD2. When the second address ADD2 is at a low level, the area selection signal generation unit 111 activates the first area selection signal SEL1 and deactivates the second area selection signal SEL2 (that is, the first area is selected). Furthermore, when the second address ADD2 is at a high level, the area selection signal generation unit 111 deactivates the first area selection signal SEL1 and activates the second area selection signal SEL2 (that is, the second area is selected).

The first area column selection signal generation unit 112 generates the first area column selection signals YS0_1 to YSM_1 in response to the first address ADD1<0:A>, when the first area selection signal SEL1 is activated. At this time, only one first area column selection signal designated by the first address ADD1<0:A> is activated. The second area column selection signal generation unit 113 generates the second area column selection signals YS0_2 to YSM_2 in response to the first address ADD1<0:A>, when the second area selection signal SEL2 is activated. At this time, only one second area column selection signal designated by the first address ADD1<0:A> is activated.

For this operation, each of the first and second area column selection signal generation units 112 and 113 may include a plurality of decoders DEC0 to DECM configured to generate the respective column selection signals as illustrated in FIG. 2. The plurality of decoders DEC0 to DECM receive the first address ADD1<0:A> and the area selection signal SEL1 or SEL2 and activate the column selection signals corresponding thereto.

It may be assumed that FIG. 2 illustrates the first area column selection signal generation unit 112. In this case, when the first area selection signal SEL1 is activated, the decoders DEC0 to DECM activate or deactivate the first area column selection signals YS0_1 to YSM_1, respectively, in response to the first address ADD1<0:A>. When the first area selection signal SEL1 is deactivated, the decoders DEC0 to DECM deactivate all of the first area column selection signal YS0_1 to YSM_1 regardless of the first address ADD1<0:A>.

It may be assumed that FIG. 2 illustrates the second area column selection signal generation unit 113. In this case, when the second area selection signal SEL2 is activated, the decoders DEC0 to DECM activate or deactivate the second area column selection signal YS0_2 to YSM_2, respectively, in response to the first address1<0:A>. When the second area selection signal SEL2 is deactivated, the decoders DEC0 to DECM deactivate all of the second area column selection signal YS0_2 to YSM_2 regardless of the first address ADD1<0:A>.

That is, when the mode signal MOD is deactivated, the selection unit 110 activates one first area column selection signal and one second area column selection signal regardless of the second address ADD2. When the mode signal MOD is activated, the selection unit 110 activates one of the first and second column selection signals in response to the second address ADD2.

As described above with reference to FIG. 1, the semiconductor memory device may separately include a selection unit for selecting the write drivers and the main drivers. At this time, the selection unit for selecting the write drivers and the main drivers may include the same circuit as the area selection signal generation unit 111 of FIG. 2.

In accordance with the embodiments of the present invention, when the number of data input/output pads is reduced depending on the operation modes, the memory device may block off a current path with the bit lines and the local lines in unselected cell area, which are not required to be coupled to each other during data input/output operation. Therefore, since data are not transmitted between the bit lines and the local lines which do not participate in data input/output, an unnecessary current is not passed to the local lines. Accordingly, the power consumption may be reduced.

While the present invention has been described with respect to the specific embodiments, it will be apparent to those skilled in the art that various changes and modifications may be made without departing from the spirit and scope of the invention as defined in the following claims.

What is claimed is:

1. A data transmission circuit, comprising:
   first to fourth local lines;
   one or more first bit line sense amplifiers configured to correspond to the first local line and correspond to one or more first bit lines, respectively;
   one or more second bit line sense amplifiers configured to correspond to the second local line and correspond to one or more second bit lines, respectively;
   one or more third bit line sense amplifiers configured to correspond to the third local line and correspond to one or more third bit lines, respectively;
   one or more fourth bit line sense amplifiers configured to correspond to the fourth local line and correspond to one or more fourth bit lines, respectively; and
   a selection unit configured to select some first to fourth bit line sense amplifiers among the one or more first to fourth bit line sense amplifiers in response to a first address in a first mode, and select some first and second bit line sense amplifiers or some third and fourth bit line sense amplifiers among the one or more first to fourth bit line sense amplifiers in response to the first address and a second address in a second mode.

2. The data transmission circuit of claim 1, wherein the first to fourth bit line sense amplifiers selected by the selection unit electrically couple some of the first to fourth bit lines corresponding thereto to the first to fourth local lines corresponding thereto.

3. The data transmission circuit of claim 2, wherein, in the first mode, data of the first local line comprise data which are firstly inputted/outputted through a first pad, data of the second local line comprise data which are secondly inputted/outputted through the first pad, data of the third local line comprise data which are firstly inputted/outputted through a second pad, and data of the fourth local line comprise data which are secondly inputted/outputted through the second pad.

4. The data transmission circuit of claim 3, wherein, in the second mode, the data of a local line corresponding to the bit line sense amplifiers selected by the selection unit, between the first local line and the third local line, comprise data which are firstly inputted/outputted through the first pad, and the data of a local line corresponding to the bit line sense amplifiers selected by the selection unit, between the second local line and the fourth local line, comprise data which are secondly inputted/outputted through the first pad.

5. The data transmission circuit of claim 1, wherein the first and second pads are data input/output pad configured to receive data from the outside of a semiconductor memory device comprising the data transmission circuit or output data to the outside of the semiconductor memory device.

6. A semiconductor memory device, comprising:
   first to fourth local lines;
   one or more first bit line sense amplifiers configured to correspond to the first local line and correspond to one or more bit lines, respectively;
   one or more second bit line sense amplifiers configured to correspond to the second local line and correspond to one or more bit lines, respectively;
   one or more third bit line sense amplifiers configured to correspond to the third local line and correspond to one or more bit lines, respectively;
   one or more fourth bit line sense amplifiers configured to correspond to the fourth local line and correspond to one or more bit lines, respectively;
   first to fourth global lines configured to correspond to the first to fourth local lines, respectively;
   first to fourth write drivers configured to drive data of the first to fourth global lines to the first to fourth local lines, respectively, during a write operation;
   first to fourth main amplifiers configured to amplify data of the first to fourth local lines and transmit the amplified data to the first to fourth global lines, respectively, during a read operation; and
   a selection unit configured to select some first to fourth bit line sense amplifiers among the one or more first to fourth bit line sense amplifiers in response to a first address in a first mode, and select some first and second bit line sense amplifiers or some third and fourth bit line sense amplifiers among the one or more first to fourth bit line sense amplifiers in response to the first address and a second address in a second mode.

7. The semiconductor memory device of claim 6, wherein the bit line sense amplifiers selected by the selection unit electrically couple some bit lines of the bit lines corresponding thereto and the local lines corresponding thereto.

8. The semiconductor memory device of claim 7, wherein, in the first mode, data of the first local line comprise data which are firstly inputted/outputted through a first pad, data of the second local line comprise data which are secondly inputted/outputted through the first pad, data of the third local line comprise data which are firstly inputted/outputted through a second pad, and data of the fourth local line comprise data which are secondly inputted/outputted through the second pad.

9. The semiconductor memory device of claim 8, wherein, in the second mode, data of a local line corresponding to the bit line sense amplifiers selected by the selection unit, between the first local line and the third local line, comprise data which are firstly inputted/outputted through the first pad, and data of a local line corresponding to the bit line sense amplifiers selected by the selection unit, between the second local line and the fourth local line, comprise data which are secondly inputted/outputted through the first pad.

10. The data transmission circuit of claim 6, wherein, during the write operation, the selection unit enables the first to fourth write drivers in the first mode, and enables the first and second write drivers or the third and fourth write drivers designated by the second address, among the first to fourth write drivers, in the second mode.

11. The data transmission circuit of claim 6, wherein during the read operation, the selection unit enables all of the first to fourth main drivers in the first mode, and enables the first and second main drivers or the third and fourth main drivers designated by the second address, among the first to fourth main drivers, in the second mode.

12. The data transmission circuit of claim 6, wherein the first and second pads comprise a data input/output pad configured to receive data from the outside of the semiconductor memory device or output data to the outside of the semiconductor memory device.

* * * * *